(12) United States Patent
Wu

(10) Patent No.: US 7,414,280 B2
(45) Date of Patent: Aug. 19, 2008

(54) SYSTEMS AND METHODS FOR MEMORY STRUCTURE COMPRISING EMBEDDED FLASH MEMORY

(75) Inventor: Chao-I Wu, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 8 days.

(21) Appl. No.: 11/255,483

(22) Filed: Oct. 21, 2005

(65) Prior Publication Data

US 2007/0090448 A1    Apr. 26, 2007

(51) Int. Cl.
*H01L 29/94* (2006.01)
(52) U.S. Cl. .................. 257/296; 257/314; 257/315; 257/317; 257/321; 257/324
(58) Field of Classification Search ............. 257/296, 257/314, 315, 316, 317, 319, 320, 321, 322, 257/323, 324
See application file for complete search history.

(56) References Cited

U.S. PATENT DOCUMENTS

| 6,011,725 A | 1/2000 | Eitan |
| 6,166,955 A | 12/2000 | Lu et al. |
| 6,815,781 B2 | 11/2004 | Vyvoda et al. |
| 2005/0070060 A1* | 3/2005 | Walker et al. ............... 438/200 |
| 2005/0286287 A1* | 12/2005 | Park et al. ..................... 365/63 |

OTHER PUBLICATIONS

Andrew J. Walker, "3D TFT-SONOS Memory Cell for Ultra-High Density File Storage Applications", pp. 29-30, 2003, Symposium on VLSI Technology Digest of Technical Papers.

* cited by examiner

*Primary Examiner*—Evan Pert
*Assistant Examiner*—Tan N Tran
(74) *Attorney, Agent, or Firm*—Baker & McKenzie LLP

(57) ABSTRACT

A memory structure that combines multiple embedded flash memory. The flash memory can be used, e.g., as air replacement cells or back up memory, or additional memory cells. In one aspect, the flash memory cells are stacked on top of the flash memory cells and the flash memory cells share a gate layer. In another aspect, pairs of stacked flash memory cells are stacked on top of each other with each pair isolated by an isolation oxide. In another aspect, pairs of stacked flash memory cells are stacked on top of each other in an un-isolated configuration.

21 Claims, 7 Drawing Sheets

SYSTEMS AND METHODS FOR MEMORY STRUCTURE COMPRISING EMBEDDED FLASH MEMORY

BACKGROUND

1. Field of the Invention

The invention relates generally to memory structures, and more particularly to the design, fabrication, and use of memory structures that comprises embedded flash memory.

2. Background of the Invention

Many conventional memory devices use flash memory cells. Many conventional flash memory cells use floating gate technology to store one or more bits of information in the floating gate when a program voltage is applied. The operation of floating gate flash memory devices is well known and will not be discussed herein for the sake of brevity. More recently, floating gate technology has been displaced by the use of other technologies that can be scaled to meet increasing memory density demands. For example, SONOS technology has become more prevalent in many applications. In a SONOS cell, the cell comprises a silicon layer (S), an oxide layer (O), a nitride layer (N), another oxide layer (O), and another silicon layer (S). Appropriate programming voltages applied to the SONOS stack causes a bit of data, or a charge, to be stored in the nitride layer. By applying the appropriate read voltages to a SONOS cell, it can be determined whether the cell has been programmed.

While there have been advancements in conventional memory cell design, such as the development of SONOS flash memory, new applications are constantly driving new memory requirements that cannot necessarily be met by the use of conventional memory structures.

As such, demands are likely to continue, and even increase, in the future, it is important to develop new techniques for memory structure design and fabrication. One such technique comprises stacked thin-film memory cells. Thin-film deposition is any technique for depositing a thin film of material into a substrate or onto previously deposited layers. "thin" is a relative term, but most such deposition techniques allow layer thickness to be controlled within a few hundred nanometers, and some allow one layer of atoms to be deposited at a time. Thus, thin-film structures can be used to reduce the overall size and allow increased density, e.g., by stacking thin-film structures. Unfortunately, the thin-film devices are not necessarily as reliable as devices constructed using more conventional deposition techniques. Thus, the applicability of thin-film structures in memory applications is limited due to their inherent unreliability.

SUMMARY

A memory cell structure comprises stacked memory cells. The stacked memory cells can be flash memory cells, where one of the stacked flash memory cells is a thin-film flash memory cell.

In one aspect, the memory cell structure can be used as a four bit memory cell structure, allowing the memory cell structure to achieve increased density compared to conventional memory cell structures.

In another aspect, the stack flash memory cell can be used as a main memory cell, while the other flash memory cell can be used for redundancy or error correction.

In another aspect, a plurality of memory cells can be stacked to achieve further memory density.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

The systems and methods described below are directed to memory cell structures that combine multiple flash memory cells. In the embodiments described, the flash memory cells are generally SONOS cells; however, this should not necessarily be seen as limiting the systems and methods described herein to the use of SONOS cells. It will be clear, that other, and future, flash cell structures can be used with the systems and methods described herein in order to achieve the benefits described. Further, certain specific embodiments of memory structures combining multiple flash cells are described below; however, the specific embodiments described should not be seen as limiting the systems and methods described herein to any particular architecture or design. It would be clear that other combinations, stacking, and arrangements of flash memory cells are possible.

Figure 1:
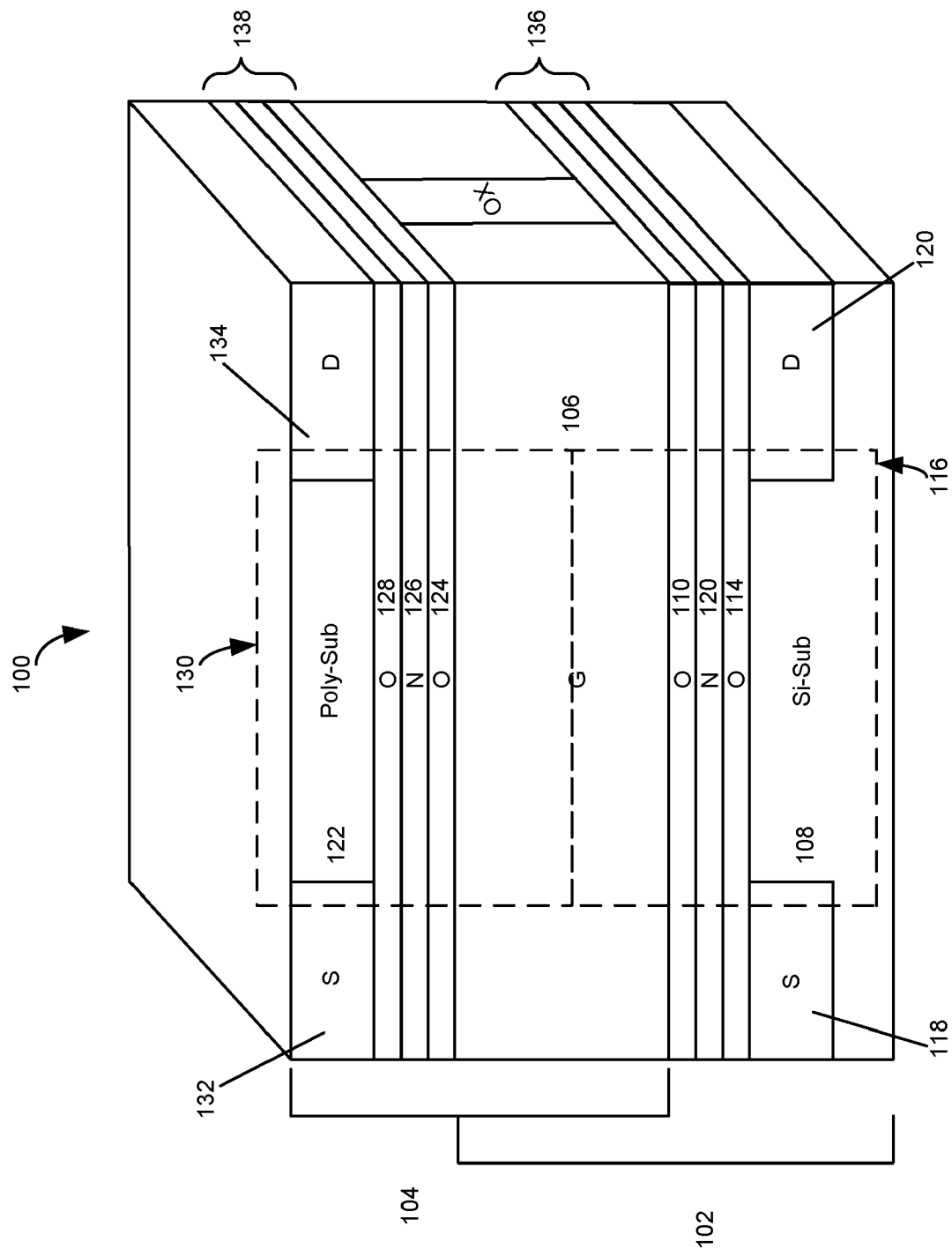
FIG. 1 is a diagram illustrating an example memory structure that combines multiple flash memory cells in accordance with one embodiment of the systems and methods described herein.

FIG. 1 is a diagram illustrating an example memory cell structure 100 that combines multiple flash memory cells in accordance with one embodiment of the systems and methods described herein. As can be seen, memory cell structure 100 comprises a first flash memory cell layer 102 and a second flash memory cell layer 104. In this example, first flash memory cell layer 102 comprises a silicon-substrate (Si-substrate) flash memory cell 116. Si-substrate flash memory cell 116 comprises a poly-silicon gate 106 above silicon-substrate 108, separated by an ONO layer 136. ONO layer 136 is formed from oxide layer 110, nitride layer 112, and oxide layer 114. Thus, in the embodiment of FIG. 1, Si-substrate flash memory cell 116 is a SONOS flash memory cell. Si-substrate flash memory cell 116 also comprises a source 118 and drain 120 constructed, e.g., via implantation.

Second flash memory cell layer 104 also comprise a flash memory cell 130. In the embodiment of FIG. 1, cell 130 is deposited on top of Si-substrate cell 116 using thin-film deposition techniques, i.e., cell 130 is thin-film structure. Poly-silicon layer 106 can act as the gate for cell 130 as illustrated. poly-silicon-substrate 122 can then form the substrate for cell 122 and can comprise drain and source regions 132 and 134 formed, e.g., through implantation techniques. Poly-silicon gate 106 can be separated from substrate 122 via ONO layer 138, which comprises oxide layer 124, nitride layer 126 and oxide layer 128. Thus, cell 130 is also a SONOS flash memory cell. But unlike cell 116, cell 130 is a thin-film structure.

As can be seen, cells 116 and 130 share poly-silicon gate 106. In one embodiment, gate 106 can be an N-type poly-silicon layer. Such a construction, i.e., comprising a co-used poly-silicon line, can be preferred in order to reduce the size and complexity of memory structure 100. As will be illustrated below, however, other embodiments can be constructed without the use of co-used poly-silicon lines.

As is well known, each SONOS cell 116 and 130 can be configured to store two bits. Thus, memory cell structure 100 can be used to achieve a compact 4-bit cell, and therefore greater memory density. Greater increase in the density can be achieved by stacking a plurality of cells, e.g., a plurality of thin-film, SONOS flash memory cells, on top of Si-substrate cell 116.

In certain embodiments, Si-substrate cell 116 can be used as a redundancy cell or as an error correction cell. Cell 116 can also be used as a high performance memory cell, due to its greater reliability as compared to thin-film cells. Thus, not only can memory cell structure 100 be used to achieve greater density than conventional memory structures, it can also be used to achieve higher performance and greater reliability as compared to conventional stacked memory devices that, e.g., make use strictly of thin-film structures.

Figure 2:
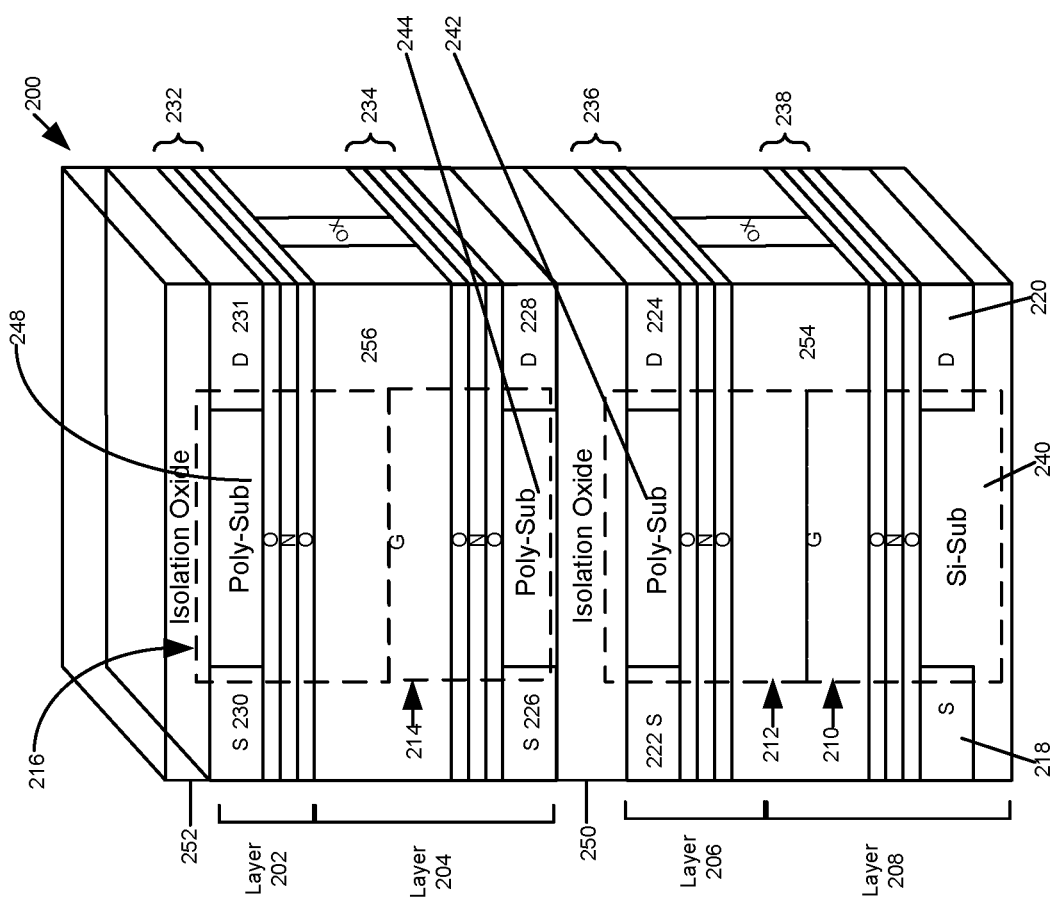
FIG. 2 is a diagram illustrating an example memory structure in accordance with the systems and methods described herein.

As mentioned above, greater density can be achieved by stacking a plurality of memory cell structures on top of a Si-substrate cell structure. For example, FIG. 2 is a diagram illustrating an example memory cell structure 200 that comprises a plurality of stacked memory cells in accordance with the systems and methods described herein. Memory cell structure 200 comprises four flash memory cell layers 202, 204, 206, and 208, respectively. Flash memory cell layer 208 is a Si-substrate layer as illustrated in FIG. 2. Thus, flash memory cell layer 208 comprises a Si-substrate flash memory cell 210 that comprises a poly-silicon gate layer 254 separated from a Si-substrate 240 via an ONO layer 238. Flash memory cell 210 further comprises a source Region 218 and drain Region 220.

Flash memory cell layer 206 is stacked on top of flash memory cell layer 208 and comprises a flash memory cell 212. As can be seen, flash memory cell 212 shares poly-silicon gate layer 254 with flash memory cell 210. The substrate of flash memory cell 212 is formed from poly Si-substrate 242 and is separated from poly-silicon gate layer 254 by ONO layer 236. Source and drain regions, 222 and 224 respectively, cannot be formed in poly Si-substrate layer 242 as shown. Thus, flash memory cell 212 can be deposited on top of Si-substrate flash memory cell 210, e.g., using thin film deposition techniques.

Flash cell structure 200 can further comprise a flash memory cell layer 204 that is stacked above flash memory cell layers 206 and 208. Flash memory cell layer 204 can comprise a flash memory cell 214. Flash memory cell 214 can comprise a gate formed from poly-silicon gate layer 256, which can be separated from a poly Si-substrate 244 via ONO layer 234. Flash memory cell 214 can further comprise a source and drain region, 226 and 228 respectively, implanted in poly Si-substrate 244. As can be seen, flash memory cell layer 204 can be isolated from flash memory cell layers 206 and 208 via an isolation oxide layer 250. It will be apparent, however, that other embodiments of a flash memory cell structure configured in accordance with the systems and methods described herein can comprise a flash memory cell layer 204 that shares a poly Si-substrate from which the source and drain regions of flash memory Cells 214 and 212 can be formed.

Flash memory cell layer 204 can be used to further increase the density of flash memory cell structure 200 as compared to conventional flash memory cell structures. Flash memory cell structure 200 can further comprise another flash memory cell layer 202 stacked on top of flash memory cell layer 204 as illustrated. Thus, the density of flash memory cell structure 200 can be increased even further.

Flash memory cell layer 202 can comprise a flash memory cell 216 that comprises a gate formed from poly-silicon gate layer 256, which can be separated from poly Si-substrate 248 by ONO layer 232. Flash memory cell 216 can also comprise source and drain regions, 230 and 231 respectively, implanted in poly Si-substrate layer 248. An isolation oxide layer 252 can be deposited on top of flash memory cell layer 202 as illustrated.

Each of the flash memory cell layers 202, 204, and 206 can be deposited on top of Si-substrate flash memory cell layer 208 using, e.g., thin film deposition techniques. Thus, flash memory Cells 212, 214 and 216 can be thin film flash memory Cells. Further, poly-silicon gate layers 256 and 254 can be shared as shown in order to decrease the size and complexity of memory cell structure 200. It will be clear, however, that another embodiments of flash memory cell layers can be formed that do not share or that do not use of any co-used poly silicon lines, such as poly silicon lines 254 and 256. It will also be apparent that each of the flash memory Cells 210, 212, 214 and 216 are SONOS flash memory Cells.

The flash memory cell structure 200 can be used to form two 4-bit memory Cells or one 8-bit memory cell depending on the embodiment. One 4-bit memory cell can be formed from flash memory cell 216 and 214, while another 4-bit memory cell can be formed from flash memory Cells 212 and 210. Depending on the embodiment, one such 4-bit memory cell can be used as a main memory cell, while the other can be used as a redundancy cell or as an error correction cell. Alternatively, certain of the cells, e.g., Cells 216 and 212, can be as memory cells, while the other cells, e.g., Cells 214 and 210 are used as redundancy cells or as error correction cells.

Figure 3:
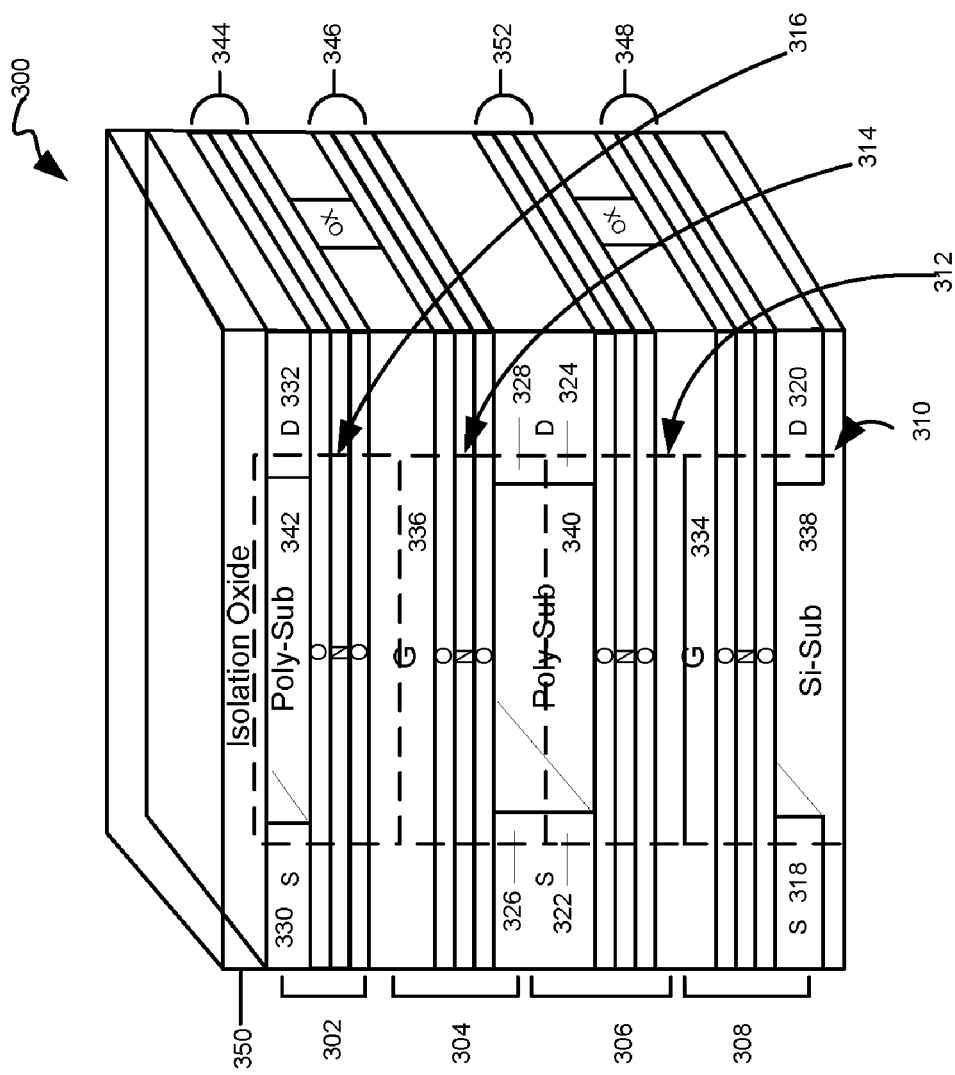
FIG. 3 is a diagram illustrating an example memory structure in accordance with the systems and methods described herein.

As mentioned, isolation oxide layer 250 is not necessarily required and can actually be eliminated depending on the embodiment. FIG. 3 is a diagram illustrating a memory cell structure 300 that also comprises four flash memory cell layers 302, 304, 306, 308, but which excludes an isolation layer such as isolation oxide layer 250. Thus, memory cell structure 300 can comprise a Si-substrate flash memory cell layer 308 that includes a flash memory cell 310. Flash memory cell 310 can comprise a gate formed from poly silicon gate layer 334 separated from Si-substrate 338 by ONO layer 348. Flash memory cell 310 can also comprise source 318 and drain 320 regions implanted in Si-substrate 338. memory cell structure 300 can further comprise a flash memory cell layer 306 that includes a flash memory cell 312 deposited on top of Si-substrate flash memory cell layer 308 as illustrated. Flash memory cell layer 306 can comprise a flash memory cell 312 that comprises a gate formed by co-used poly silicon gate layer 334, which can be separated from poly Si-substrate 340 by ONO layer 352. Flash memory cell 312 also comprises source and drain regions 322 and 324, respectively.

Flash memory cell structure 300 can also comprise flash memory cell layer 304 deposited on top of flash memory cell layer 306. Flash memory cell layer 304 can comprise a flash memory cell 314 as illustrated. Flash memory cell 314 can include a gate formed from poly silicon gate layer 336, which can be separated from co-used poly Si-substrate 340 by ONO layer 346. Flash memory cell 314 can also comprise source and drain regions 326 and 328, respectively, implanted in co-used poly Si-substrate 340.

Flash memory cell 300 can further comprise a flash memory cell layer 302 deposited on top of flash memory cell layer 304 as illustrated. Flash memory cell layer 302 can comprise a flash memory cell 316 that includes a gate formed from co-used poly silicon gate layer 336, which is separated from poly Si-substrate 342 by ONO layer 344. Source and drain regions, 330 and 332 respectively, can be implanted in by Si-substrate layer 342. An isolation oxide layer 350 can be deposited on poly Si-substrate 342.

Thus, flash memory cell structure 300 makes use of co-used poly silicon lines 334 and 336 as well as co-used poly Si-substrates 340 and 342. Use of such co-used poly silicon lines and substrates can decrease the size and complexity of a memory cell structure configured in accordance with the systems and methods described herein, and can therefore be preferable; however, as mentioned, and illustrated in FIG. 2, other embodiments in which certain flash memory cell layers are isolated from certain other flash memory Cells are also possible.

Generally, by stacking multiple SONOS cells in this way increasing memory density demands can be met. Multiple stacked flash memory cells, such as stacked SONOS cells generally provide a greater number of bits of storage for a given area.

FIGS. 1-3 illustrates specific implementations of a memory structure that comprises multiple flash memory cells in accordance with the systems and methods described herein. It will be clear, however, that the systems and methods described herein are not limited solely to the implementations illustrated in FIGS. 1-3. For example, other implementations can use co-used poly-silicon lines or not use co-used poly-silicon lines in ways not illustrated by the embodiments of FIGS. 1-3.

Depending on the embodiment, the bottom flash memory can be used, e.g., as an air replacement cell, or a memory storage cell. The use of the flash memory cell will be dependent on the specific implementation for a flash structure configured in accordance with the systems and methods described herein. Thus, the specific requirements of a particular implementation will dictate how the flash memory cells are used.

FIGS. 4A-4D illustrate an example method for fabricating a memory structure comprising flash memory cells in accordance with one of the embodiment of the systems and methods described herein. The process can begin in FIG. 4A with a deposition of an ONO layer 402 on top of silicon-substrate 406. Next, a photo resist 404 can be deposited on top of ONO layer 402 as illustrated. In the next step, photo resist 404 can be photo defined. Electron implantation can then be used to define the source 408 and drain 410 within silicon-substrate 406.

Figure 4A:
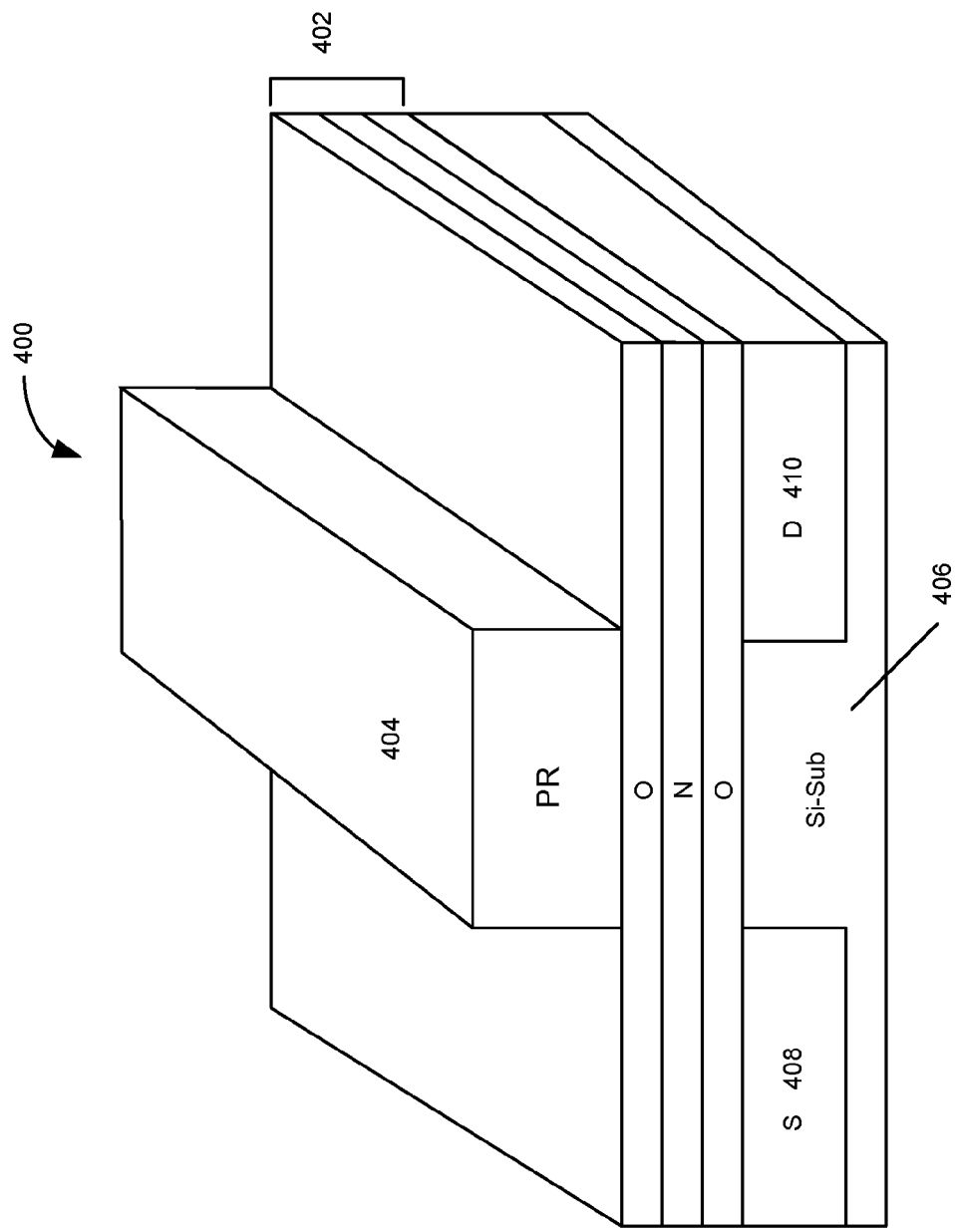
FIGS. 4A-4D illustrate an example method for fabricating a memory structure comprising flash memory cells in accordance with one of the embodiment of the. systems and methods described herein.
Figure 4B:
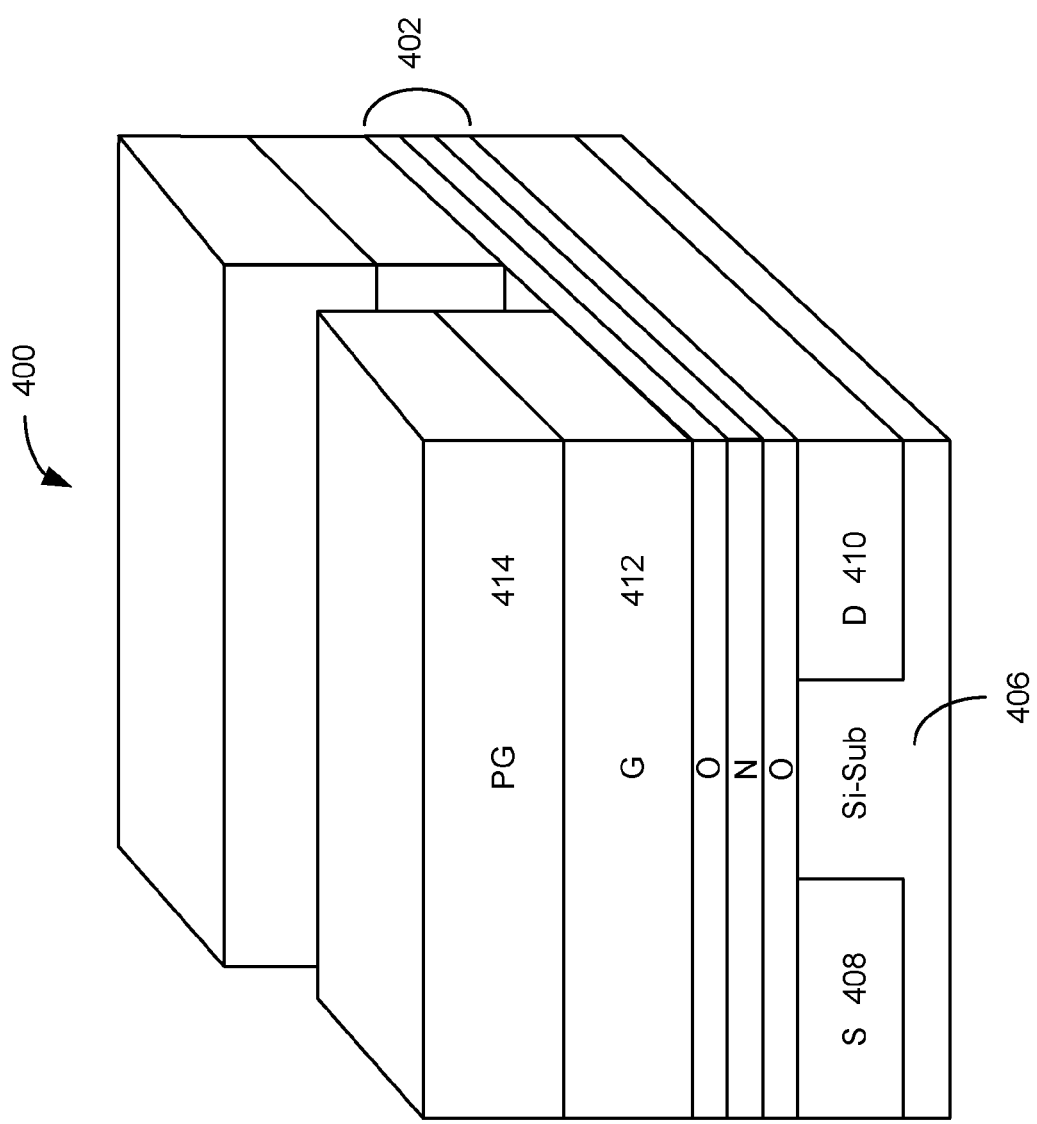

Next, as illustrated in FIG. 4B, the photo resist layer 404 from FIG. 4A can be removed and the next poly-silicon layer, in this case N-type layer 412, can be deposited. It will be understood that poly-silicon layer 412 can be deposited in areas defined by the photo definitions described above. Next, photo resist layer 414 can then be deposited on top of poly-silicon layer 412 and photo resist layer 414 can be photo defined in the next step. Poly-silicon layer 412 can then be poly etched as required in the next step.

Figure 4C:
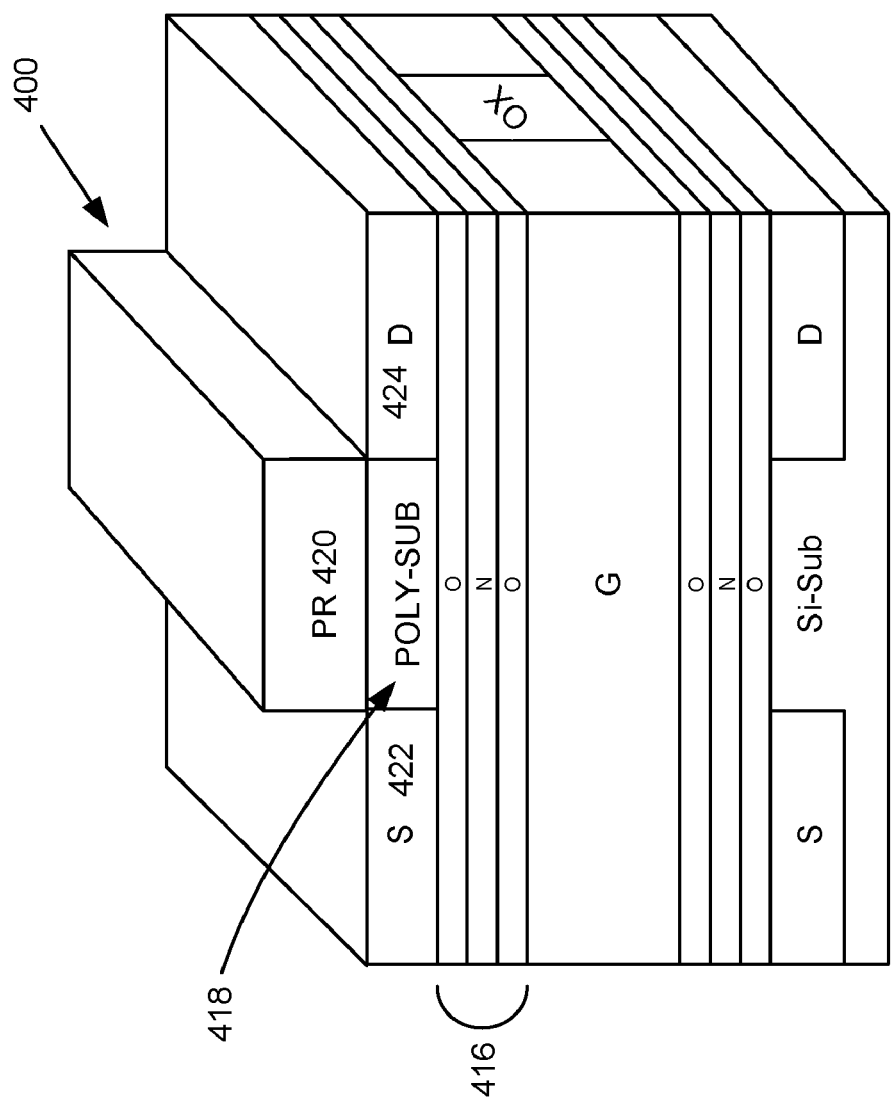

In the next step, FIG. 4C, photo resist layer 414 can be removed. This step can be followed by the deposition of an oxide layer, the oxide layer can then be etched back in the next step and this can be followed by the deposition of an ONO layer 416. Next, P-type poly-silicon layer 418 can be deposited and photo resist layer 420 can be deposited above poly-silicon layer 418 as illustrated. Photo resist layer 420 can then be photo defined. Electron implantation can then be used to define the source 422 and drain 424 within poly-silicon-substrate 418.

Figure 4D:
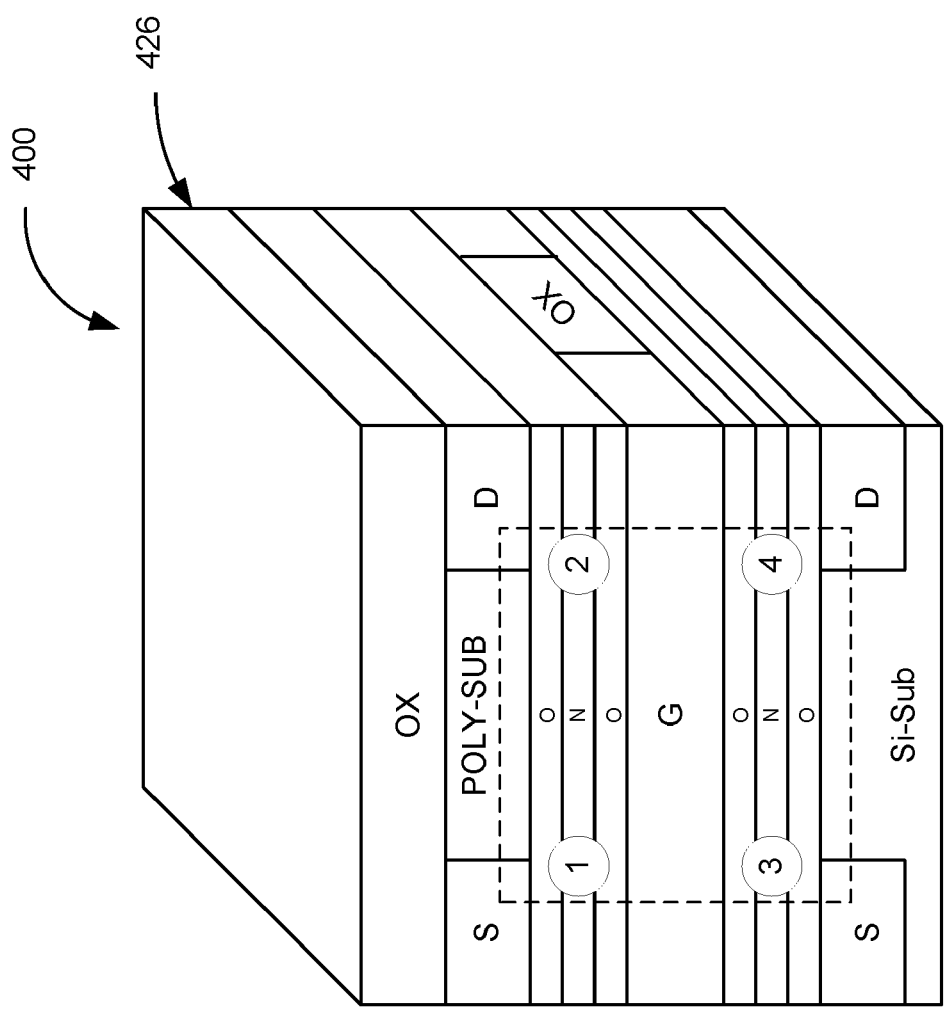

Next, as illustrated in FIG. 4D, photo resist layer 422 of FIG. 4C can be removed and oxide layer 426 can be deposited on top of the structure as shown. FIG. 4D also illustrates storage of four bits within an example memory structure as signified by the circles number 1, 2, 3, and 4. The bits can be stored as localized areas of charge within the nitride layers. The nitride layers do not conduct; therefore electrons that "jump" over the potential barrier of the oxide layer as they travel from source to drain and become trapped. As the electrons travel from source to drain they gain energy, therefore, it is most likely that the electrons will "jump" over the potential barrier of the oxide layer near the drain. This is why, for example, circles 2 and 4 are located near the drains. Note that to program the bits represented by circles 1 and 3 the functions of the source and drain are reversed, e.g. voltages are applied so that electrons flow in the reverse direction. When a bit is programmed, e.g., charge is stored in the localized are indicated by the circles, it can indicate, for example a logic "0" while a lack of charge can, for example, indicate a logic "1". In this way bits of data can be stored in the memory device.

The process illustrated by FIG. 4A-4D is just one example process for fabricating a memory structure that includes flash memory cells in accordance with the systems and methods described herein. It will be understood that other fabrication processes and techniques can be used in order to achieve a memory structure that includes flash memory cells configured as described herein.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A memory structure, comprising:
   a silicon-substrate flash memory cell structure comprising a silicon-substrate flash memory cell; and
   a thin-film flash memory cell structure comprising a thin-film flash memory cell, the thin-film flash memory cell structure formed on top of the silicon-substrate flash memory cell structure,
   wherein the memory structure is configured such that the silicon-substrate flash memory cell and the thin-film flash memory cell comprise channels having a same charge carrier type.

2. The memory structure of claim 1, wherein the silicon-substrate flash cell is a SONOS flash memory cell.

3. The memory structure of claim 1, wherein the thin-film flash memory cell is a SONOS flash memory cell.

4. The memory cell structure of claim 1, wherein the silicon-substrate flash memory cell and the thin-film flash memory cell comprise a co-used poly-silicon gate layer.

5. The memory structure of claim 1, further comprising a plurality of thin-film flash memory cell structures comprising a plurality of thin-film flash memory cells formed on top of the silicon-substrate flash memory cell layer.

6. The memory cell structure of claim 5, wherein at least some of the plurality of thin film flash memory cell layers are isolated from each other via isolation oxide layers.

7. The memory cell structure of claim 5, wherein at least some of the plurality of thin-film memory cells co-use a poly—silicon-substrate.

8. The memory cell structure of claim 5, wherein at least some of the plurality of thin-film memory cells comprise a co-used poly-silicon gate layer.

9. The memory structure of claim 1, wherein the silicon-substrate flash memory cell is used as a redundancy cell.

10. The memory structure of claim 1, wherein the silicon-substrate flash memory cell is used as an error correction cell.

11. The memory structure of claim 1, wherein the silicon-substrate flash memory cell and thin-film flash memory cell form a four bit memory cell.

12. The memory structure in claim 1, wherein the silicon-substrate flash memory cell and the thin-film flash memory cell are each configured to store two bits of data, wherein the first bit is stored by trapping electrons substantially adjacent to a drain node of the memory cell and the second bit is stored by trapping electrons substantially adjacent to a source node of the memory cell.

13. A method for fabricating a memory structure comprising a plurality of flash memory cell layers, comprising:
   fabricating a silicon-substrate flash memory cell structure; and
   fabricating a thin-film flash memory cell structure on top of the silicon-substrate flash memory cell structure,
   wherein the memory structure is configured such that the silicon-substrate flash memory cell and the thin-film flash memory cell comprise channels having a same charge carrier type.

14. The method of claim 13, wherein fabricating the silicon-substrate flash memory cell layer comprises:
   forming an ONO layer on top of a silicon-substrate;
   forming a source and drain region in the silicon-substrate.

15. The method of claim 14, wherein fabricating the silicon-substrate flash memory cell structure further comprises forming an N-type poly-silicon layer on top of the ONO layer.

16. The method of claim 15, wherein fabricating the thin-film flash memory cell structure comprises etching the N-type poly-silicon layer.

17. The method of claim 16, wherein fabricating the thin-film flash memory cell layer further comprises depositing oxide layers on top of the N-type poly silicon layer and etching the deposited oxide layers.

18. The method of claim 17, wherein fabricating the thin-film flash memory cell layer further comprises forming an ONO layer on top of the N-type poly-silicon layer and depositing a P-type poly-silicon layer on top of the ONO layer.

19. The method of claim 18, wherein fabricating the thin-film flash memory cell layer further comprises forming a source and drain region in the silicon-substrate.

20. The method of claim 19, wherein fabricating the thin-film flash memory cell further comprises depositing an isolation oxide layer on top of the P-type poly silicon layer.

21. The method of claim 13, wherein the silicon-substrate flash memory cell and the thin-film flash memory cell are each configured to store two bits of data, wherein the first bit is stored by trapping electrons substantially adjacent to a drain node of the memory cell and the second bit is stored by trapping electrons substantially adjacent to a source node of the memory cell.

* * * * *